(12) United States Patent
Yamaguchi et al.

(10) Patent No.: US 9,040,937 B2
(45) Date of Patent: May 26, 2015

(54) CHARGED PARTICLE BEAM APPARATUS

(71) Applicant: HITACHI HIGH-TECHNOLOGIES CORPORATION, Tokyo (JP)

(72) Inventors: Kohei Yamaguchi, Tokyo (JP); Takehiro Hirai, Tokyo (JP); Ryo Nakagaki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/391,671

(22) PCT Filed: Mar. 11, 2013

(86) PCT No.: PCT/JP2013/056558
§ 371 (c)(1),
(2) Date: Oct. 9, 2014

(87) PCT Pub. No.: WO2013/153891
PCT Pub. Date: Oct. 17, 2013

(65) Prior Publication Data
US 2015/0060667 A1    Mar. 5, 2015

(30) Foreign Application Priority Data

Apr. 13, 2012    (JP) .................................. 2012-091497

(51) Int. Cl.
| G06T 7/00 | (2006.01) |
| H01J 37/26 | (2006.01) |
| H01J 37/22 | (2006.01) |
| H01J 37/28 | (2006.01) |
| H01L 21/66 | (2006.01) |

(52) U.S. Cl.
CPC ............... *G06T 7/0004* (2013.01); *H01L 22/12* (2013.01); *H01L 22/20* (2013.01); *H01J 37/222* (2013.01);
(Continued)

(58) Field of Classification Search
USPC .............. 250/306, 307, 309, 310, 399, 492.1, 250/492.2, 492.21, 492.3, 582, 583, 586; 700/109, 110, 121, 173, 174; 702/32, 702/33, 35, 36, 46, 75, 78, 81, 82, 84; 714/25, 37, 704; 382/149, 325
See application file for complete search history.

(56) References Cited

U.S. PATENT DOCUMENTS 6,172,363 B1 *   1/2001   Shinada et al. .................... 850/9
6,329,826 B1 * 12/2001   Shinada et al. ........... 324/754.22
(Continued)

FOREIGN PATENT DOCUMENTS

| JP | 2004-288743 A | 10/2004 |
| JP | 2008-004641 A |  1/2008 |

(Continued)

OTHER PUBLICATIONS

International Search Report issued in International Application No. PCT/JP2013/056558 mailed Jun. 18, 2013, with English translation.

*Primary Examiner* — Bernard E Souw
(74) *Attorney, Agent, or Firm* — McDermott Will & Emery LLP

(57) ABSTRACT

In a pattern inspection of a semiconductor circuit, to specify a cause of a process defect, not only a distribution on and across wafer of the number of defects but also more detailed, that is, the fact that how many defects occurred where on the semiconductor pattern is needed to be specified in some cases. Accordingly, the present invention aims to provide an apparatus capable of easily specifying a cause of a process defect based upon a positional relationship of a distribution of defect occurrence frequency and a pattern. The apparatus includes: a charged particle beam optical system for detecting secondary charged particles by irradiating the charged particle beam to the sample; an image processing unit for, based upon a plurality of images to be inspected that are obtained by the secondary charged particles, obtaining an occurrence frequency of defect candidates for each of predetermined regions inside the detected image; and a display unit for displaying the distribution of the occurrence frequency of the defect candidates so that a positional relationship to the pattern is recognized.

14 Claims, 15 Drawing Sheets

(52) U.S. Cl.
CPC ....... *H01J 37/28* (2013.01); *H01J 2237/24592* (2013.01); *H01J 2237/2817* (2013.01); *G06T 2207/10061* (2013.01); *G06T 2207/30148* (2013.01); *H01J 37/26* (2013.01)

(56) References Cited

U.S. PATENT DOCUMENTS

| 7,405,088 | B2 * | 7/2008 | Matsushita et al. | 438/4 |
|---|---|---|---|---|
| 7,529,631 | B2 * | 5/2009 | Matsushita et al. | 702/35 |
| 8,041,103 | B2 * | 10/2011 | Kulkarni et al. | 382/144 |
| 8,594,823 | B2 * | 11/2013 | Park et al. | 700/110 |
| 2003/0062487 | A1 * | 4/2003 | Hiroi et al. | 250/492.2 |
| 2004/0255198 | A1 | 12/2004 | Matsushita et al. | |
| 2007/0230770 | A1 * | 10/2007 | Kulkarni et al. | 382/149 |
| 2008/0004823 | A1 * | 1/2008 | Matsushita et al. | 702/82 |
| 2011/0172804 | A1 | 7/2011 | Park et al. | |
| 2013/0265408 | A1 * | 10/2013 | Yamaguchi et al. | 348/80 |

FOREIGN PATENT DOCUMENTS

| JP | 2010-529683 A | 8/2010 |
|---|---|---|
| WO | 2011/008688 A2 | 1/2011 |

\* cited by examiner

CHARGED PARTICLE BEAM APPARATUS

RELATED APPLICATIONS

This application is the U.S. National Phase under 35 U.S.C. §371 of International Application No. PCT/JP2013/056558, filed on Mar. 11, 2013, which in turn claims the benefit of Application Japanese No. 2012-091497, filed on Apr. 13, 2012, the disclosures of which are incorporated by reference herein.

TECHNICAL FIELD

The present invention relates to a charged particle beam apparatus provided with defect inspecting means, and more specifically to a defect inspecting apparatus and a review apparatus.

BACKGROUND ART

A semiconductor device, such as a memory, a microcomputer or the like for use in a computer or the like, is manufactured by repeatedly carrying out transferring processes on a pattern such as a circuit or the like formed on a photomask by using an exposing process, a lithography process, an etching process and the like. In the manufacturing process of the semiconductor device, the quality of the results of processes such as the lithography process, the etching process or the like and the existence of a defect such as the occurrence of a foreign matter or the like, give great influences to the yield of the semiconductor device. Therefore, in order to improve the yield, a pattern inspection on a semiconductor wafer is carried out upon completion of each of the manufacturing processes so as to detect the occurrence of abnormality and the occurrence of a defect previously or in its early stage.

In the inspecting apparatus used for the above-mentioned processes, there have been strong demands for executing an inspection with high throughput and high precision so as to follow up an increase in the wafer diameter and a miniaturization of the circuit pattern. In order to inspect a large number of regions in a short period of time while maintaining high inspection precision, one of proposed inspection methods for the semiconductor device includes processes in which some of regions on a wafer previously specified are determined beforehand, and images of a plurality of portions are picked up during the execution of inspecting processes of one time, and the resulting images are inspected. Moreover, in order to confirm the reason of a process failure, a method has been widely used in which the amount of characteristics, such as the number of defects at each of portions in the entire wafer or in one portion thereof, is displayed on a wafer so that the tendency thereof is confirmed. For example, a patent described in Patent Document 1 has proposed a method in which a defect distribution formed into groups based upon a shot unit or a chip unit of an exposing device or a frequency distribution of the amount of characteristics is prepared so that by using the distribution, the cause of a defect of a semiconductor device is specified. Moreover, Patent Document 2 has proposed a method in which plurality of divided regions are formed on a wafer and by using the distribution of the amount of characteristics possessed by each of the regions, the distribution of defects occurred in the respective wafers are automatically classified based upon the wafer unit.

Patent Document 1: Japanese Patent Application Laid-Open Publication No. 2008-4641 (US2008/0004823)

Patent Document 2: Japanese Patent Application Laid-Open Publication No. 2004-288743 (US2004/0255198)

SUMMARY

In a pattern inspection of a semiconductor circuit, in order to specify the cause of a process failure, it is sometimes necessary to specify not only a distribution over a wafer, such as the number of defects, but also, more specifically, which portion of a semiconductor pattern has many defects occurred therein. For example, in the case of defects between line patterns, the degree of importance defers greatly depending on whether or not many defects occur as roughness along line edges or whether or not many pattern shorts occur. In this case, since the defect distribution on a wafer divided into a plurality of sections as shown in Patent Documents 1 and 2 only provides information indicating that many defects occur at a position or coordinates where the line pattern exists, these methods sometimes only give insufficient information. It is essential to find out what positional relationship relative to the line pattern causes frequent occurrences of defects so as to clarify the cause of defects.

Therefore, the object of the present invention is to provide an apparatus capable of easily specify the cause of process defects based upon the distribution of the occurrence frequency of defects and the positional relationship relative to the pattern.

In order to solve the above-mentioned problems, a charged particle beam apparatus in accordance with the present invention is provided with a charged particle beam optical system for detecting a secondary charged particle by irradiating the charged particle beam to a sample, an image processing unit which, based upon a plurality of detected images obtained by the secondary charged particles, finds out an occurrence frequency of defect candidates for each of predetermined regions inside the detected image, and a display unit for displaying the distribution of the occurrence frequency of defect candidates in association with a pattern on the sample.

In accordance with the present invention, since a positional relationship between the distribution of occurrence of defects and the pattern is presented to the user, it becomes possible to easily specify the reason for a process failure.

BRIEF DESCRIPTIONS OF THE DRAWINGS

DETAILED DESCRIPTION

The following description will explain embodiment of the present invention by means of examples. The embodiment of a defect inspection apparatus for detecting defects on the surface of a semiconductor wafer and a defect inspection process will be explained; however, these are exemplary only of the present invention, and the present invention is not intended to be limited by the embodiment explained below. For example, the defect inspection apparatus explained here widely corresponds to those apparatuses which acquire an image and determine the presence or absence of a defect based upon the acquired image. Moreover, in the case of a charged particle beam apparatus, such as a review apparatus or the like, those apparatuses provided with a defect inspection means, such as a means for inspecting predetermined positions on a sample so as to carry out a fixed-point observation or a process monitoring operation, have been proposed, and of course, the present embodiment can be applicable to these charged particle beam apparatuses, and the defect inspection apparatus to be described below is supposed to include these apparatuses. Additionally, the fixed-point observation refers to a process for specifying a place to be desirably managed in processes, such as a place where a failure tends to easily occur inside a chip, and for picking up an image of the corresponding place, and the process monitoring refers to a managing process in which by inspecting the number of defects on a wafer, the increasing or decreasing state thereof and the places thereof, or the like, a managing process is carried out as to whether or not any abnormality is occurring in individual manufacturing process of a semiconductor, such as a pattern machining process, a washing process or the like.

Embodiment 1

In embodiment 1, explanations will be given to a defect inspection apparatus which extracts defect candidates from a comparative image of a portion corresponding to an image to be inspected, and displays the defect candidates included in a specified region as defects.

Figure 1:
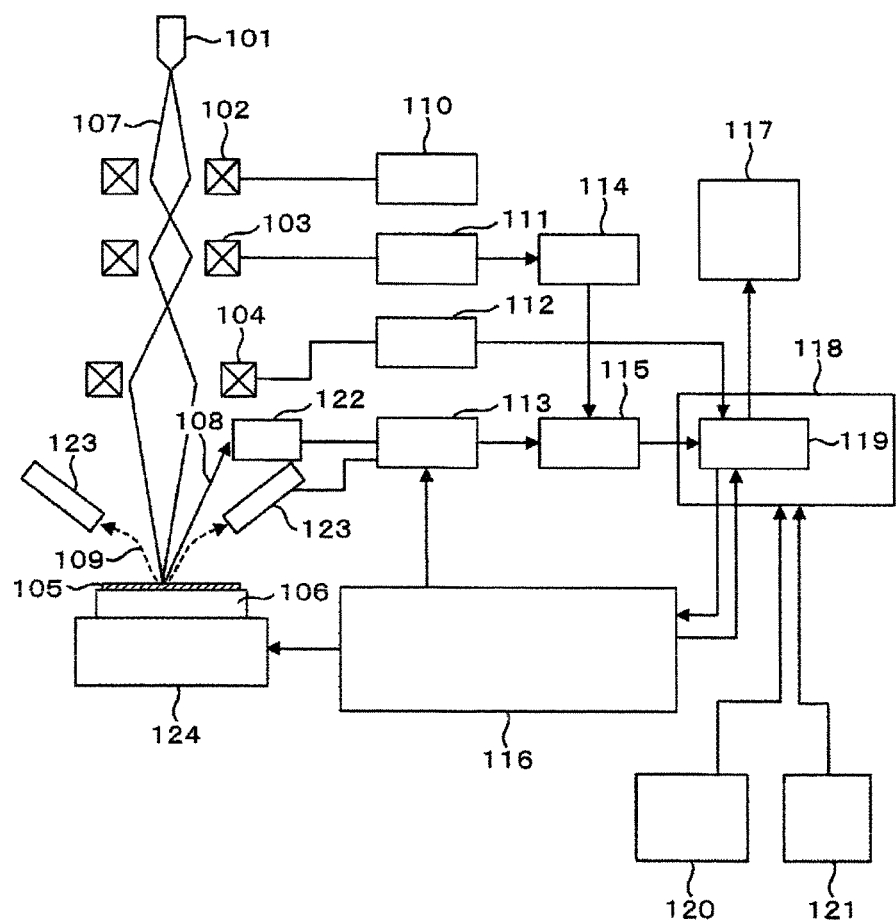
FIG. 1 is an overall block diagram of a charged particle beam apparatus.

FIG. 1 is a schematic view showing an overall structural example of a defect inspection apparatus. The defect inspection apparatus is provided with a scanning electron microscope (SEM) constituted by an electron gun 101 that discharges an electron beam 107, a lens 10 for focusing the electron beam 107, a deflector 103 for controlling a deflection of the electron beam 107, an objective lens 104 for focusing the electron beam 107, a sample base 106 on which a sample 105 is mounted, a secondary electron detector 122 and reflected electron detectors 123 for detecting a secondary electron 108 and a reflected electron 109 that are generated by irradiating the electron beam 107 to the sample 105, a moving stage 124 for moving the sample base 106, and the like. The reflected electron detectors 123 are installed on a straight line at such positions as to be made face to face with each other, so as to pick up paired shadow images. Moreover, these devices are disposed in a column (not shown), and can be maintained in vacuum by using a vacuum pump (not shown).

The electron beam 107 discharged from the electron gun 101 is focused by the lens 102, and after having been scanned and deflected two-dimensionally by the deflector 103, is further focused by the objective lens 104 and irradiated onto the sample 105. When the electron beam 107 is irradiated to the sample 105, secondary electrons 108 and reflected electrons 109 that correspond to the shape and the material of the sample 105 are generated. These secondary electrons 108 and the reflected electrons 109 are detected by the secondary electron detector 122 or the reflected electron detectors 123, and after having been amplified by an amplifier (not shown), these are converted to a digital value by an analog/digital (A/D) converter 113. Signals from the reflected electron detectors 123 are used for forming an L image and an R image that are reflected electron images, and a signal from the secondary electron detector 122 is used for forming an S image that is a secondary electron image. Signals obtained from samples, such as secondary electrons, reflected electrons and the like, are collectively referred to hereinbelow as secondary charged particles. Unless otherwise specified, an image processing operation may be carried out by using the L image, R image and S image or a composite image of these, and in the present specification, these are collectively referred to generally as images. The data converted to digital values are stored in an image memory 115. At this time, an address control circuit 114 generates an address that is in synchronism with the scanning signal of the electron beam 107 as an address for image data to be stored in the image memory 115. Moreover, the image memory 115 transfers the stored image to an image processing unit 119 on demand.

In the image processing unit 119, the image data thus transferred are sent to a display unit 117 such as a display or the like through a control unit 118, and arithmetic processing is performed based upon the image data so that processes, such as a defect extracting process or the like, are carried out. The defect extracting (detecting) process in this case is carried out by calculating and comparing the transferred image data with other image data obtained from a pattern corresponding to the image data. The image processing unit 119 will be de described later.

The lens 102, the deflector 103 and the objective lens 104 are controlled by control signals respectively released from a lens control circuit 110, a deflector control circuit 111 and an objective lens control circuit 112 so that the focal point position and deflection amount of the electron beam 107 are controlled. Thus, the electron beam 107 is adjusted so as to be irradiated to an appropriate position on the sample 105. Moreover, the moving stage 124 on which the sample base 106 is mounted can be shifted in parallel two-dimensionally by a control signal from a mechanism control circuit 116. Therefore, the sample 105 held by the sample base 106 is also shifted in parallel two-dimensionally so that the position at which the electron beam 107 is scanned on the sample 105 can be controlled. Additionally, all the lens control circuit 110, the deflector control circuit 111, the objective lens control circuit 112 and the mechanism control circuit 116 are controlled by signals from the control unit 118.

Moreover, an input unit 120 constituted by a keyboard, a mouse or the like is used for operations of GUI (Graphical User Interface) such as device operations and parameter settings displayed on the display unit 117, and an external input/output unit 121 is used for exchanging electronic files between an external storage device, such as an HDD, a USB memory or the like, and the main apparatus. Furthermore, the output/input port of a communication means such as a LAN may also be utilized.

Figure 2:
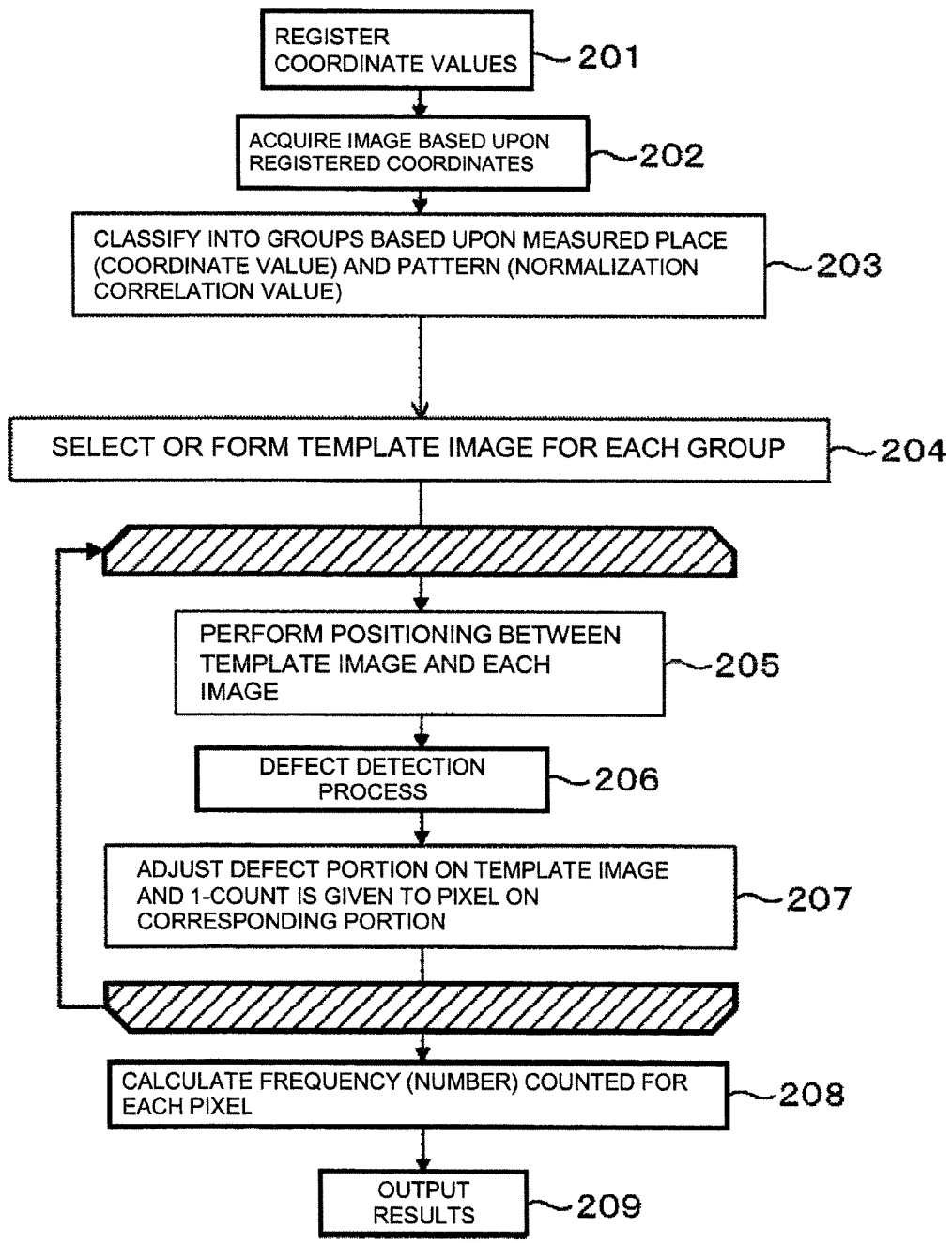
FIG. 2 is a process flow chart of the present embodiment.

The following description will explain the image processing unit 119 in which processes, such as a template image generation, a classifying process of acquired image into groups, detection of defect candidates, determination of defects and a registration process of the frequency of defects, are carried out, and these respective functional blocks may be constituted by a combination of arithmetic processing circuits for executing the processes of the respective units (a so-called hard assembly), or by installing memories storing programs corresponding to the processes of the respective units in the image processing unit 119, as well as by allowing processors installed in the image processing unit 119 in the same manner to execute the programs, a flow of processes virtually shown in FIG. 2 may be realized. Moreover, some portions of the functional blocks may be realized by exclusively-used processing circuits, and the rest of the functional blocks may be realized on a software basis by the programs and processors.

FIG. 2 shows a flowchart of the present embodiment.

Figure 3:
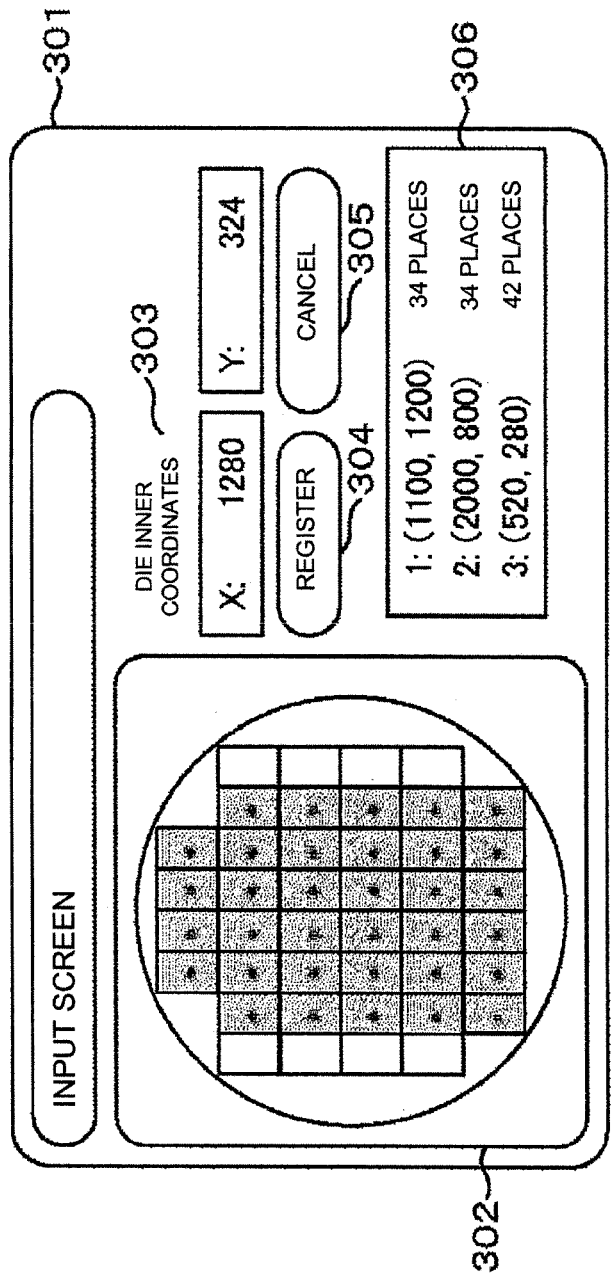
FIG. 3 shows a GUI for use in inputting an observation portion on a wafer.

First, in step S201, a place from which an image on a wafer is acquired is specified. With respect to a means for specifying the place, the corresponding coordinates may be directly inputted through the input device 120, or a GUI for an auxiliary inputting process so as to register a plurality of places at one time by selecting chips as shown in FIG. 3 may be previously installed, and the inputting process may be carried out through this. By using the GUI for the auxiliary input, the inputting load of the user can be reduced. FIG. 3 shows the coordinates inputting GUI, which indicates a die configuration on a wafer, and is constituted by a wafer map screen 302 that is also used for selection of a die to be observed, a coordinates input unit 303 through which coordinates inside the die are actually inputted, a registering button 304, a cancel button 305, and a list 306 showing a list of observation places that have been registered. The user inputs coordinates inside the die to the coordinates input unit 303 by using the input device, and a die to be observed is selected by directly clicking it on the wafer map screen 302. On the wafer map screen 302, the selected die is displayed with a gray color, and the point inside the selected die indicates an actual observation place. If no problem is raised in the inputted contents, the list 306 is registered when a register button is clicked. In the case of deleting the inputted contents, the cancel button 305 is clicked. The list 306 displays the list of inputted observation places, and in the present example of the list, the X-coordinate and Y-coordinate of the inside of the die are indicated inside parentheses, with the number of observation places being described at the neighboring portion. The input auxiliary GUI of this type may be prepared so as to allow the user to input, or a file with coordinates written thereon, formed by another device or personal computer, may be read from the external input/output unit 121.

Next, the sequence proceeds to step 202, and the wafer is shifted based upon the coordinate value inputted in step 201 so that an image of the registered coordinates is picked up. The image is inputted to the image memory 115.

Figure 4:
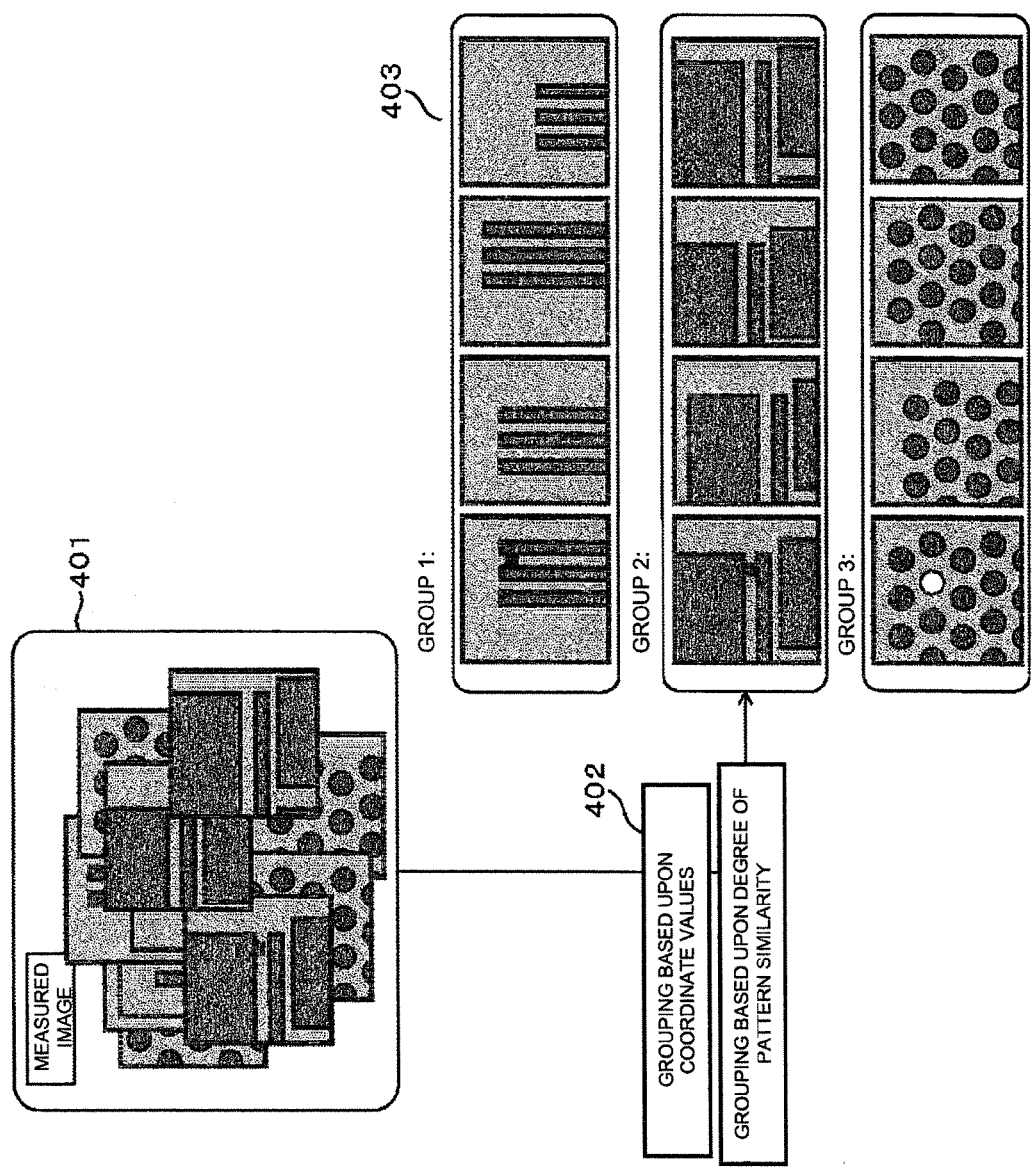
FIG. 4 is an explanatory view showing an acquired image to be classified into groups.

Next, in step 203, the acquired image is classified into groups based upon coordinate values or the degree of similarity of circuit patterns. With respect to the criteria of the classifying process into groups, in the case of the coordinate values, one image is selected, and in the case when the acquired coordinates of the image and the acquired coordinates of the other images are included inside a predetermined range, these images are classified into one group. In the case of the circuit pattern, one image is selected, and a normalization correlation value between the image and each of the other images is calculated, and those images whose maximum values are a fixed value or more are regarded as images containing the same circuit pattern, and these images can be classified into one group. FIG. 4 is an explanatory view thereof, which shows the contents of the classifying processes in which the acquired image 401 is classified into three groups indicated by 403 based upon the coordinate values or the degree of similarity of the circuit patterns. Either one of these grouping methods may be selected, or both of them may be used in combination. Moreover, as long as the method is used for classifying into the images of the same shapes, another method may be used. There is sometimes a case in which, within a wafer in-plane, there are a plurality of portions having the same or a similar pattern. In such a case, by finding the occurrence frequency of defects depending on the degree of similarity of the patterns, it is possible to more easily specify a defect caused by the process.

Next, for each of the groups classified in step 203, images are inputted to a template image generation unit 201 so that a template image is determined (step 204). The template image may be selected by the user from images of the respective groups or previously registered images, or may be generated by carrying out arithmetic processing, such as an adding process or the like, on the images to be inspected. In this case, the template image refers to an optimal image regarded as having no defects, which is obtained by an image processing such as an image addition or the like, and corresponds to an image for use as a comparative image at the time of detecting a defect. As the image processing for use in generating the template image, any method may be used as long as an optimal image considered to be free from defects can be generated.

Figure 5:
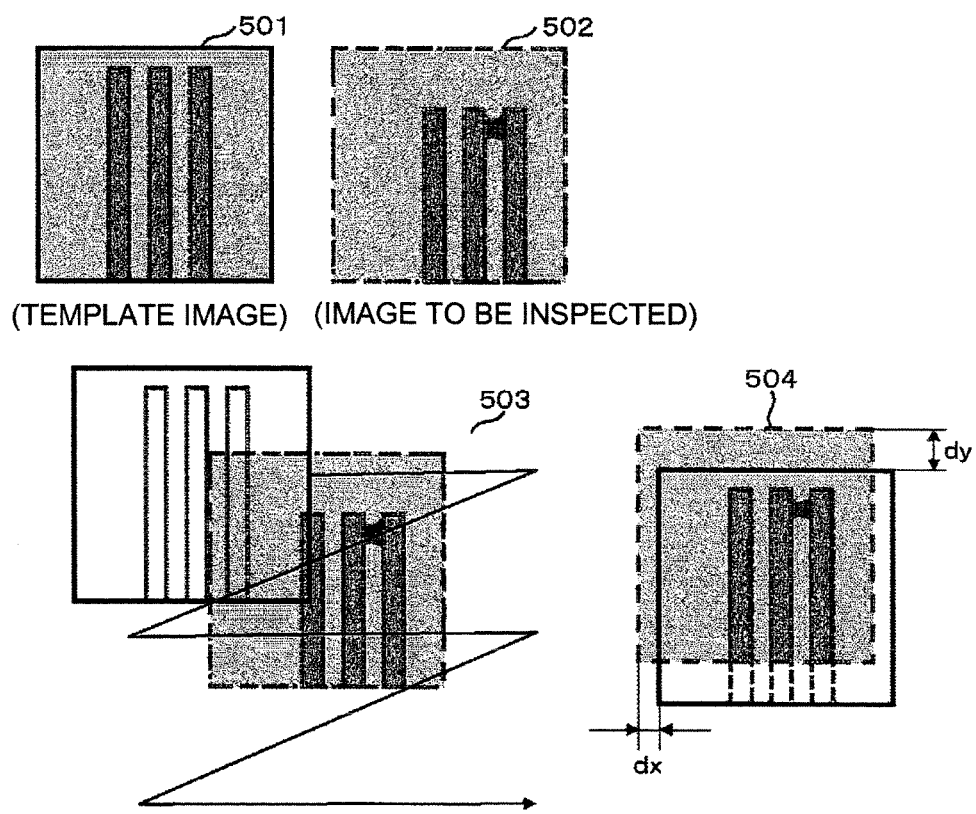
FIG. 5 is an explanatory view showing a positioning process between a template image and an image to be inspected.

In the next step 205, by using the template image generated in the present process, a positioning process is carried out between the template image and each of images belonging to the same group for each of the groups. This process is also used for determining coordinates at the time of finding the frequency of generation of defects (step 207), in addition to the usage in the succeeding defect detection process (step 206). As the positioning method, for example, as shown in 503 in FIG. 5, a method is proposed in which, by finding a normalization correlation value at each of places by scanning the template image 501 on the image to be inspected 502, the portion having the highest value is regarded as a place where the patterns are coincident with each other so that the shift amount of the image is found. The shift amount corresponds to each of values indicated by dx and dy in FIG. 5. Of course, any other methods may be used as long as the positional relationship between the template image and the image to be inspected can be specified.

Figure 6:
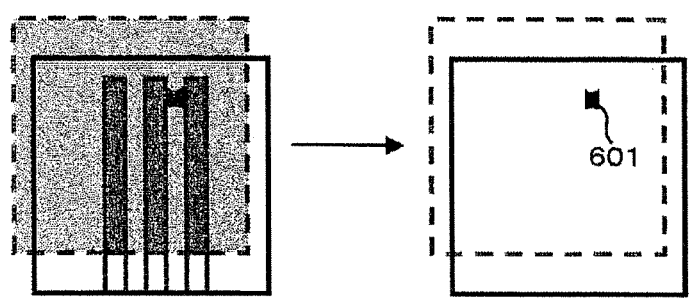
FIG. 6 is an explanatory view for defect detection.

By shifting the image by a portion corresponding to the shift amount of the image found in the positioning process so as to subject the image to a subtraction process, a differential value of each pixel can be obtained. FIG. 6 is an explanatory view showing the contents of this process. An image surrounded by a square of a dotted line in FIG. 6 is an image to be inspected 502, and an image surrounded by a square of a solid line is a template image 501. A portion in which the differential value is a fixed value or more, that is, a portion in which there is a difference of a fixed value or more from the template image is detected as a defect candidate (step 206) In FIG. 6, this portion corresponds to 601. Normally, the defect candidate is detected as a region including a plurality of pixels. Additionally, the defect candidate refers to a region extracted by the above-mentioned comparing process, and does not necessarily correspond to a defect; however, in the present specification, it is sometimes referred to simply as "defect". Additionally, the defect detecting process may be carried out by using another method. For example, in the case when the defect candidate is extracted by using a method for finding a contour line of the defect candidate based upon comparison with design data or the like, the following processes can be carried out in the same manner, by dealing with a region inside the contour line as the defect candidates.

Figures 7, 8:
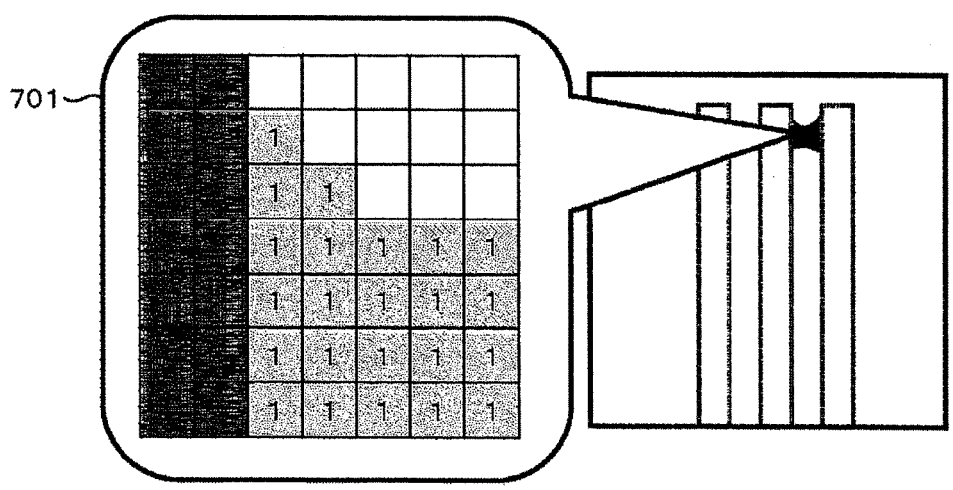
FIG. 7 is an explanatory view showing a pixel in which a defect is occurring.
FIG. 8 is an explanatory view showing an occurrence frequency of defects for each of pixels.

The region detected as the defect candidate is stored in the image memory as coordinates on the template image for each of pixels, and 1 is added to the pixel of the corresponding portion (step 207). FIG. 7 is an explanatory view thereof, and a portion having a square shape on the right side indicates the template image. In this case, 701 represents an expanded view indicating a portion above the left side of a portion 601 detected as a defect in FIG. 6, and each of the lattices corresponds to a pixel of the image. As the results of the defect detection, to the pixel corresponding to a gray color portion of 701 specified as the defect, a count of frequency is added. In this case, "1" of 701 represents a frequency of additions, and 701 indicates that a defect of one time occurred on the pixel on which "1" is written.

By carrying out these processes on each of a plurality of pixels within the same group, it is possible to clarify how many times defects have occurred in each of the pixels on the template image. FIG. 8 is an explanatory view thereof showing an example in which on the same view as that of 701, the occurrence frequency (number of times) is written. Additionally, in the present embodiment, the counting of defect occurrences is given to all the pixels within the defect region; therefore, in the case when the defect region is located in a manner so as to bride over a wiring line, even if a corresponding portion is present on the wiring line, the counting is carried out as the defect.

FIG. 7 and FIG. 8 are diagrams just for explaining the contents and are not necessarily required to be shown to the user; however, by displaying a such a diagram, for example, as shown as 701, the frequency can be confirmed in more detail.

After completion of the processes of steps 205 to 207 with respect to images belonging to the same group, the same processes are repeatedly carried out on the next group. Thus, a defect occurrence pixel for each of images in each of the groups and the defect occurrence frequency for each of the pixels recorded based upon the position of the template image as reference can be found (step 208). Moreover, in step 208, the maximum value and the minimum value of the occurrence frequency for each of the groups may be found. As will be described later by reference to FIG. 10, the occurrence frequency can be standardized by using the maximum value and the minimum value.

Figure 9:
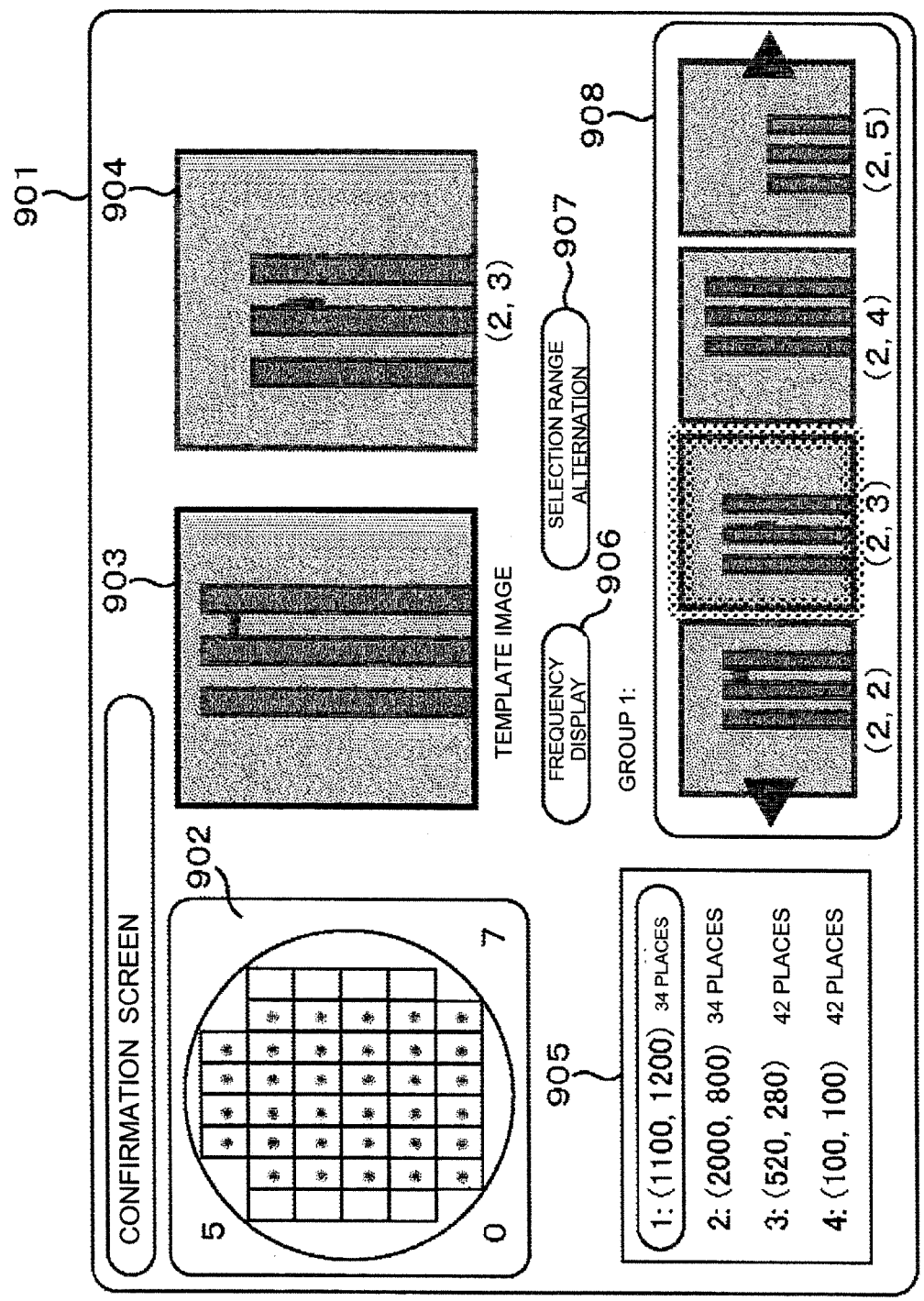
FIG. 9 shows a GUI for displaying the occurrence frequency of defects.

Lastly, based upon the defect occurrence frequency thus found, the frequency is illustrated on the template image (step 209). FIG. 9 is a display example of a resulting display GUI. FIG. 9 shows a result confirming window 901. The inside of the result confirming window 901 is constituted by a wafer map screen 902 displaying image acquiring portions on a wafer, a template image 903, an acquired image 904, a group list 905, a frequency display button 906, a selection range alternation button 907 and an acquired image thumbnail display and selection GUI 908. By clicking the frequency display button 906, the user is allowed to confirm the occurrence frequency, with the drawing indicating the frequency being overlaid on the template image. Alternatively, the drawing indicating the frequency may be overlaid on the acquired image 904. In this case, the overlaying process needs to be carried out, with the place being shifted for each of the images by the amount of positioning found in step 205. The image 904 of the acquired place can be selected by clicking an image inside the selection GUI 908, or by clicking a dot indicating the observation place inside the wafer map screen 902. The triangular portions on the right and left sides of the selection GUI 908 are used for displaying an image of another observation portion when clicked so as to switch displays. Moreover, the group list 905 indicates classified groups, and by directly clicking the character of each of the groups, images of observation places included in the group can be displayed on the result confirming window 901.

Figure 10:
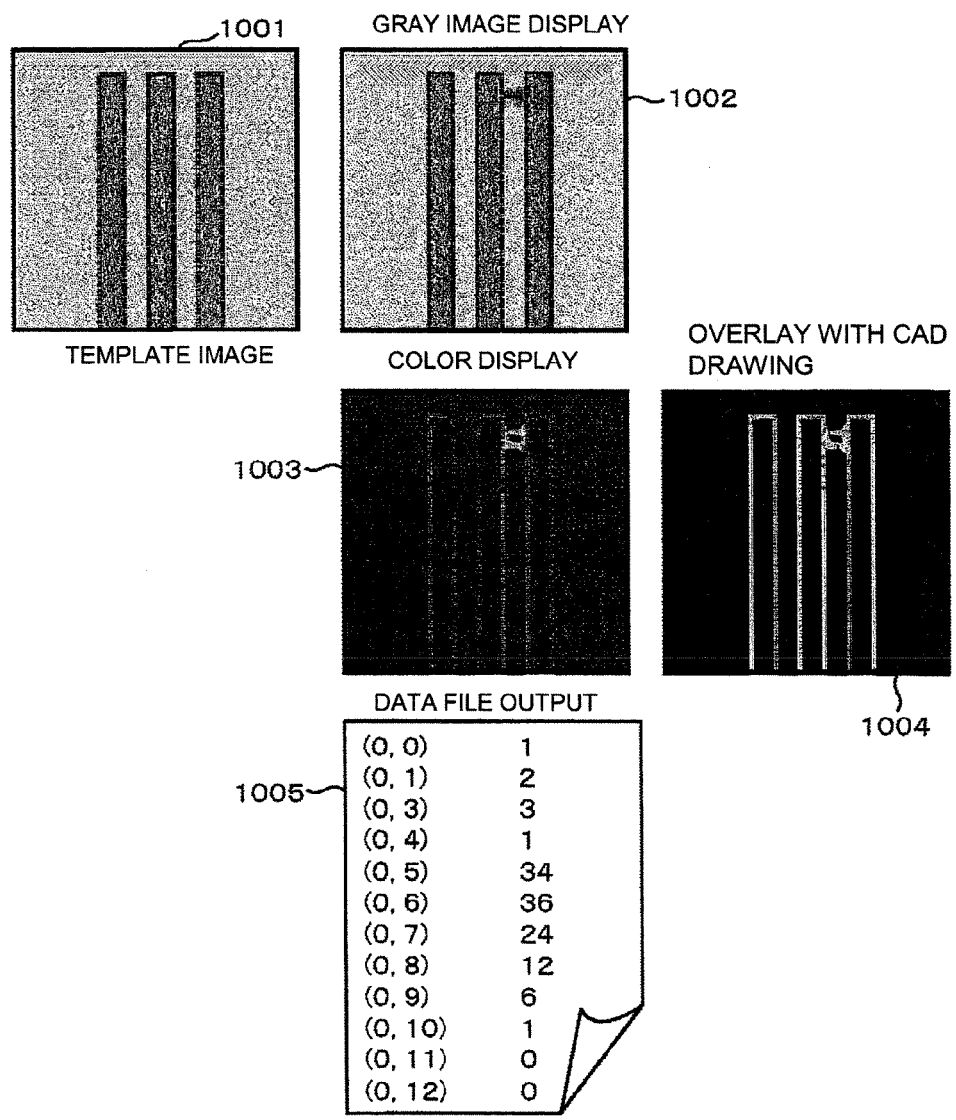
FIG. 10 is an explanatory view showing a display example and an output example of the occurrence frequency of defects.

As a method for illustrating the frequency, for example, a method is proposed in which the occurrence frequency is standardized by the maximum value and a color corresponding to its ratio is painted onto each of the pixels and displayed. FIG. 10 explains the method. FIG. 10 shows a display example in which on a template image indicated by 1001, a gray image display (1002) representing the level of the occurrence frequency by its density is given, another display example in which on the template image shown by 1001, a color display (1003) in which the level is indicated based upon differences in colors is overlaid, and the other display example (1004) in which a CAD diagram and the frequency display are combined with each other. In the case of the composite image with the CAD diagram, for example, a correlation relationship between an image corresponding to an extracted contour line from the template image and positioning on the CAD diagram is found and the coordinates on the CAD diagram of the frequency distribution from the portion having the highest correlation value are found, and by overlaying these on each other, the display is obtained.

In this manner, by separately painting colors so as to distinguish a portion having high frequency and a portion having low frequency, the occurrence frequency of defects can be easily understood visually. The way how to paint separately includes, for example, to paint separately so as to change from cold colors to warm colors like a thermograph, or to paint separately by using thick and faint portions of black and white, or the like, and is not particularly limited only by these examples. In order to clarify the cause of defects, it is preferable to display the in-plane distribution of the defect occurrence frequency so as to clarify the positional relationship with the pattern.

Moreover, the numeric value of each of the pixels is formed into a text, and this may be outputted as a file (1005). The file 1005 forms a schematic drawing of data files, with its coordinate values being shown in parentheses, and with the occurrence frequency (number of times) being written on the neighboring portion, and for example, in addition to the usage in comparison with the CAD data, this file can be used as data for further analyses.

Figure 11:
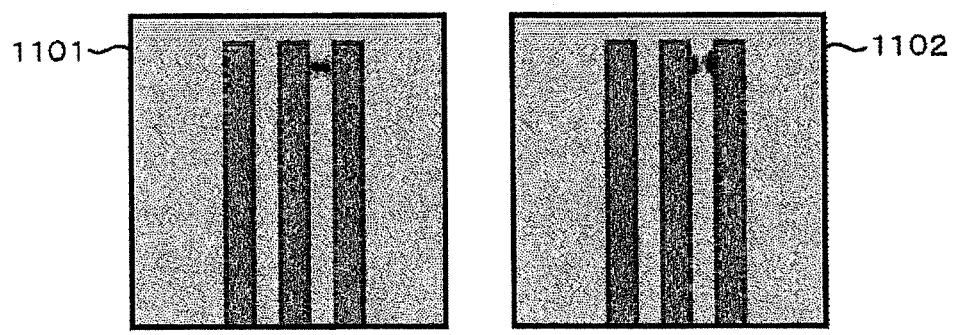
FIG. 11 is an explanatory view showing a state in which the distributions of the occurrence frequency of defects are different.

As described above, the occurrence frequency of defects may be displayed for each of the groups, and this display may be used as a means for finding a clue for specifying the cause of occurrences of defects in more detail. Referring to FIG. 11, the specifying process for the cause of occurrences of defects will be explained. For example, FIG. 11 shows images 1101 and 1102 on which two kinds of defect occurrence frequencies are displayed. The original circuit pattern is given as a template image 1001. Each of the images 1101 and 1102 indicates that many defects occur at a tip of a gap between two line patterns on the right side of three line patterns, and it is indicated that as the density of the color becomes higher, the occurrence frequency also becomes higher. The image 1101 indicates that many defects occur between the line patterns, and the image 1102 indicates that many defects occur on pattern edges, and it is presumed that many short-circuit defects occur in the image 1101 and that many fluctuations in roughness of edges occur in the image 1102. In this manner, showing the occurrence frequency can be used as a means for knowing the characteristics of defects contained in each of the observation places in more detail. Moreover, observations may be carried out at a plurality of places, and these may be used as the summary of the results of defect detections that have been executed. In the case when the number of the observation places becomes enormous, it requires a great amount of labor to confirm the tendency of the entire system with respect to the defect occurrence by confirming each of individual images; however, by confirming the image of the occurrence frequency, the state of the defect occurrence can be confirmed by using an image of one sheet.

In the above-mentioned embodiment, the unit by which the occurrence frequency of defects is found is set to each of pixels; however, it may be found by using a larger unit. Any desired size of the unit may be selected depending on the resolution for each of the detection apparatuses; however, in the case when the frequency is found by using a range larger than the circuit pattern, since less information is obtained as the result, the largest guiding size is set to about half the width of the circuit pattern. In short, the upper limit of the unit by which the occurrence frequency of defects is found is said to be a level that allows the positional relationship between the occurrence region of defects and the pattern to be recognized.

Moreover, after finding the occurrence frequency of defects for each of the pixels, by adding the frequencies in the plurality of pixels to one another, the added value may be displayed as the occurrence frequency of defect candidates for each of the corresponding plurality of pixels. This arrangement makes it possible to shorten the display time in an image having a large number of pixels, and can be utilized upon displaying a reduced image.

Moreover, upon classifying into groups in step 203 of the present embodiment, rotation symmetrical or inversion symmetrical images may be collectively classified as one group. This arrangement can be realized by rotating or inverting the respective images to be inspected so as to find a normalization correlation value. This method can be used, for example, upon collecting patterns on four corners of a Cell portion into one pattern.

Figure 12:
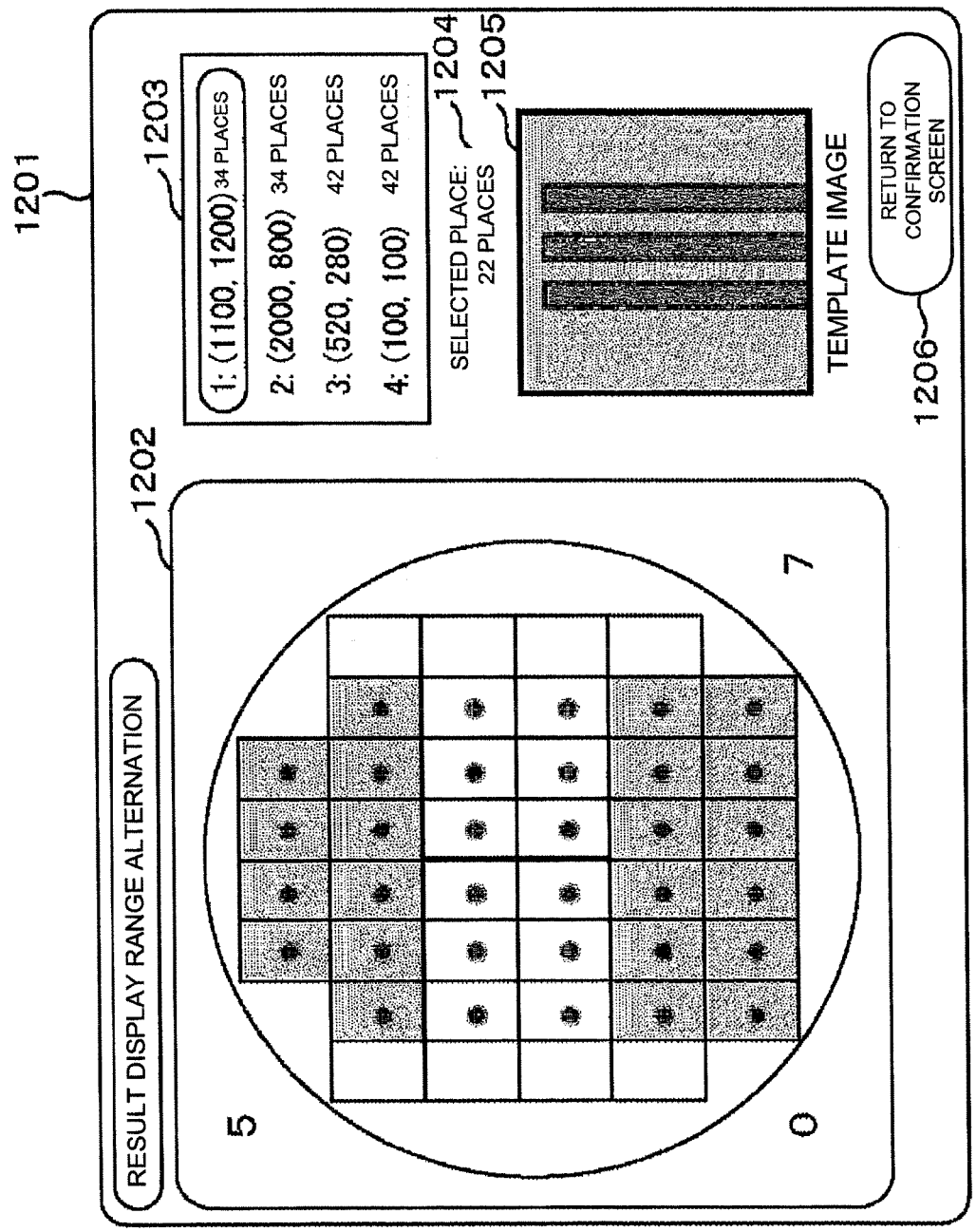
FIG. 12 shows a GUI for use in altering an object range for finding the occurrence frequency of defects.

In the above-mentioned example of step 209, with respect to images in each of the groups, all the images included in the group are used as the target; however, images of one portion thereof may be used as the target. The selection range alternation button 907 is a button for use in calling for the corresponding setting window, and when clicked, a setting window 1201 shown in FIG. 12 is displayed. The window 1201 includes a GUI 1202 for carrying out a display selection of a die or an observation place on a wafer, a button 1203 for use in displaying and selecting the group, a button 1204 indicating the number of selections of the display places, a button 1205 for displaying the template image of the group selected by the button 1203 and a button 1206 for use in finishing the alternation of the display range and returning to the confirmation screen (901 of FIG. 9). In the GUI 1202, by clicking a point (points inside the GUI 1202) indicating the die or the observation place selected as the display target, the corresponding target can be selected, and the selected die or point is painted to a color indicating the selection (in the figure, gray in the case of the die). Moreover, the number of the selected places is displayed on 1204. The selection and non-selection can be switched each time the clicking is carried out. With respect to the image of the die or observation place selected on this screen, the occurrence frequency is again calculated in step 208 so that upon returning to the confirmation screen 901, the occurrence frequency of the selected die or the observation point is displayed. Moreover, in accordance with the selection of the die or observation point, the occurrence frequency may be displayed within the template image 1205 in real time. Additionally, the switching of the groups is carried out by directly clicking the character of the group display 1203. When, after finishing the settings, the button 1206 is clicked, the sequence returns to the confirmation screen 901. In this manner, when the user is allowed to select only the die image on one portion of the wafer as the target, the occurrence frequency can be found in a divided manner, for example, on the wafer outer peripheral portion as well as on the wafer center portion, and this process is effectively applied to the identification of the cause of a process failure.

Figure 13:
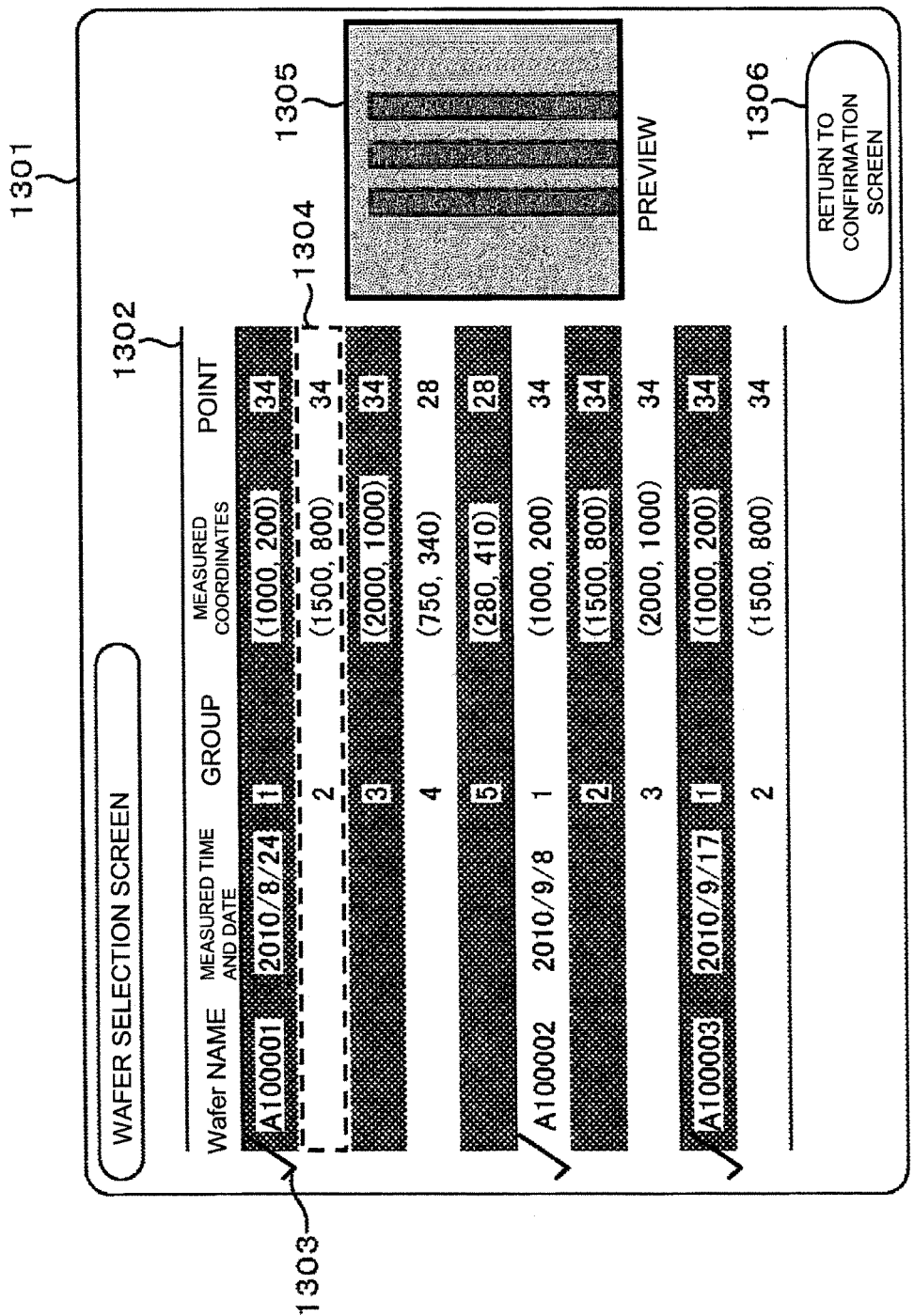
FIG. 13 shows a GUI for use in selecting a plurality of wafers.
Figure 15:
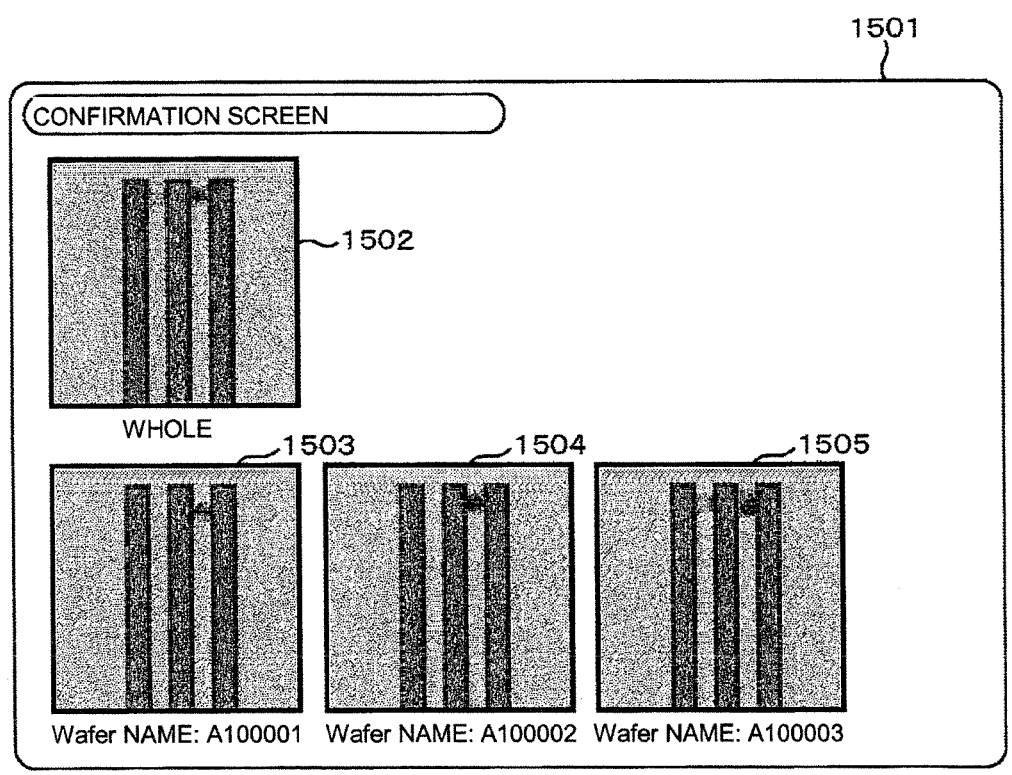
FIG. 15 shows a GUI for displaying the occurrence frequency of defects in the case when a plurality of wafers are selected.

Moreover, the window 901 shows a display example of one sheet of wafer; however, the defect occurrence frequency may be displayed by using a plurality of sheets of wafers as the targets. FIG. 13 and FIG. 15 show structural examples of GUI for use in this explanation. FIG. 13 is a GUI structural example for selecting a plurality of sheets of wafers. A selection screen window 1301 is constituted by a wafer list 1302, a check mark 1303 indicating a selected state, a selected place 1304 of the list 1302, a window 1305 for providing a preview display of an acquired image at the selected place, and a button 1306 for use in finishing the selection and proceeding to the confirmation screen. On the list 1302, the name of a wafer, the time and date of observation, the group, the observation coordinates of each of the groups and the number of images in the group (the number of points) are written in succession from the left side. When the left end portion of this list is clicked, the check mark 1303 is added to the portion of the wafer name to indicate the selected state. Additionally, in an attempt to confirm the images of a group, when any desired line in the list is clicked, the images of the group indicated by the corresponding line are displayed on the window 1305 at random. Alternatively, the template image of the selected group may be displayed on the window 1305.

Figure 14:
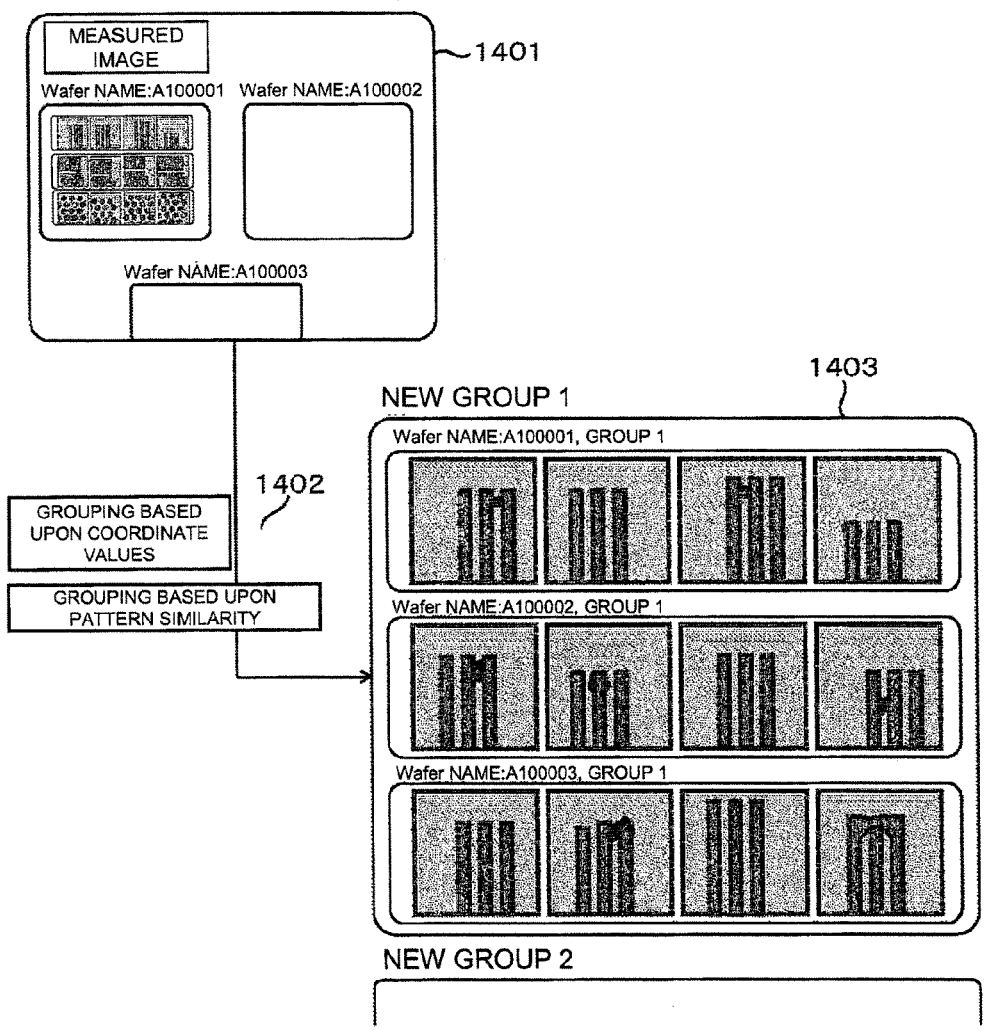
FIG. 14 is an explanatory view showing an acquired image to be classified into groups in the case when a plurality of wafers are selected.

With respect to a grouping process of the wafer images selected in FIG. 13, the process can be realized by carrying out the same processes as those explained in FIG. 4 and step 203. FIG. 14 is an explanatory view of the grouping process in the case of a plurality of wafers. On a window 1401, a schematic view showing a state in which images of three sheets of wafer names A100001, A100002 and A100003 are selected is prepared, with one portion of the acquired images being omitted. In a window 1402, in the same manner as in 402, all the images of A100001, A100002 and A100003 are classified into groups based upon coordinate values or the degree of similarity of patterns, and classified as shown in a window 1403. The window 1403 provides a view for use in explaining the contents of a classified state in which a plurality of wafer images are newly classified into a new group 1, a new group 2, etc. With respect to images in the new groups, processes of step 205 to step 207 are carried out so that the results for each of the new groups can be displayed. FIG. 15 is a view explaining these processes.

FIG. 15 shows an occurrence frequency confirmation screen in the case of a plurality of wafers, and in particular, the case of the new group 1 in FIG. 14 is exemplified. GUI's 902 to 908 explained in FIG. 9 and a new group display switching GUI are omitted. In a confirmation window 1501, a window 1502 indicating the occurrence frequency over the entire acquired images of a plurality of selected wafers and windows 1503 to 1505 showing the occurrence frequency of each of the wafers for use in comparison are displayed. In this manner, the result of frequency may be displayed for each of the groups, or in the case when the same group is present over the respective wafers, the result of frequency of the corresponding group may be further displayed for each of the wafers. Since the wafers were processed in succession in the previous processes, a time-sequential management of the occurrence frequency of defects can be carried out by displaying the occurrence frequency of defects for each of the wafers. Moreover, by comparing the entire frequency 1502 with the occurrence frequencies of 1503 to 1505 of the individual wafers, it is possible to identify whether a defect is occurring only on a specific wafer or a defect is occurring over the entire wafers that have been subjected to a processing treatment.

The occurrence frequency thus calculated can be applied to the identification of kinds of a defect detected in each of the acquired images, that is, to the identifying process as to whether the defect is a systematic defect or a random defect. In this case, the identifying method is a method to be carried out on the assumption that the defect of a portion occurring at a high frequency is a systematic defect, with a defect other than this being a random defect, and in this sense, the words of the systematic defect and the random defect are used in the following description. In other words, the systematic defect is a defect that tends to occur on the same pattern position, while the random defect is a defect that occurs at random regardless of the pattern position.

Figure 16:
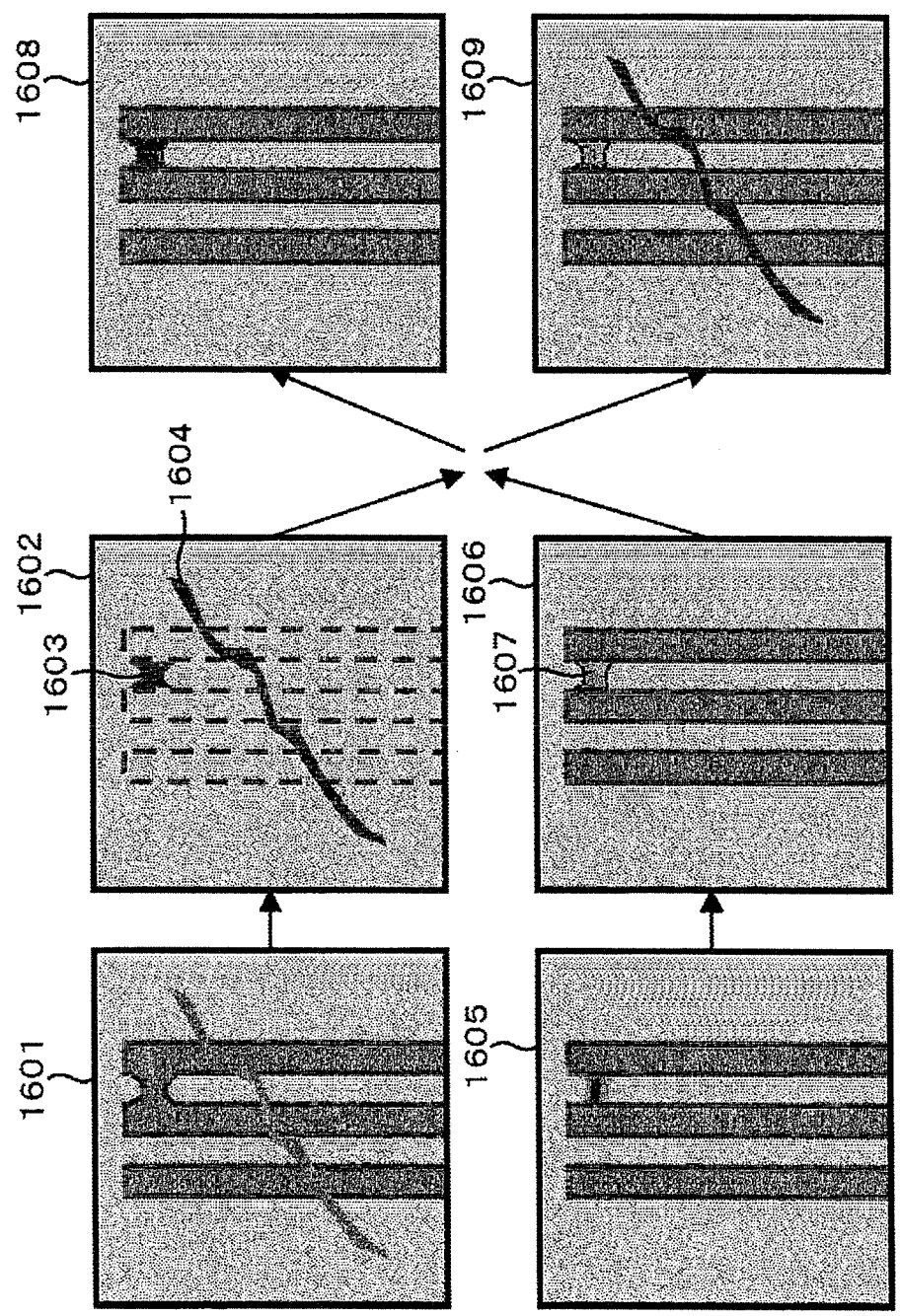
FIG. 16 is an explanatory view for identifying kinds of defects.

FIG. 16 is an explanatory view for explaining this identifying method. In step 206, a defect detecting process is carried out on an acquired image 1601, and suppose that as shown in 1602, two defects 1603 and 1604 are detected. Moreover, also suppose that the defect occurrence frequency of a group including the acquired image 1601 is shown by an in-plane distribution drawing of 1605. The image 1605 indicates that many defects occur at a gap between two line patterns on the right side of three line patterns. With respect to this image, a portion 1607 inside a region 1606 collectively shows pixels having the occurrence frequency of a fixed level or more. Depending on how much degree the detected defects 1603 and 1604 are overlaid with this portion 1607, it is determined whether the corresponding defect is the systematic defect or the random defect. For example, 1608 shows a drawing in which the defect 1603 is overlaid with the region 1606 based upon the circuit pattern position as a reference, and 1609 shows a drawing in which the defect 1604 is overlaid with the region 1606 in the same manner. In the case of 1608, since the most of the portion of the defect 1603 is included in the portion 1607, it is determined as the systematic defect, and in the case of 1609, since the defect 1604 is not included in the portion 1607 at all, it is determined as the random defect. More specifically, it is determined by calculating what percentage of the pixels of 1603 and 1604 is respectively included in the pixels of 1607 as well as what percentage of the pixels of 1607 is included respectively in the pixels of 1603 and 1604, based upon the coordinates of the pixels of 1607, 1603 and 1604. Additionally, it is preferable to allow the user to previously set the threshold value of determination as to whether it is the systematic defect or the random defect. In this manner, by finding the size of overlaid regions between the region having a fixed value or more of the defect occurrence frequency and the region detected as a defect candidate, it is possible to determine whether it is the systematic defect or the random defect.

Figure 17:
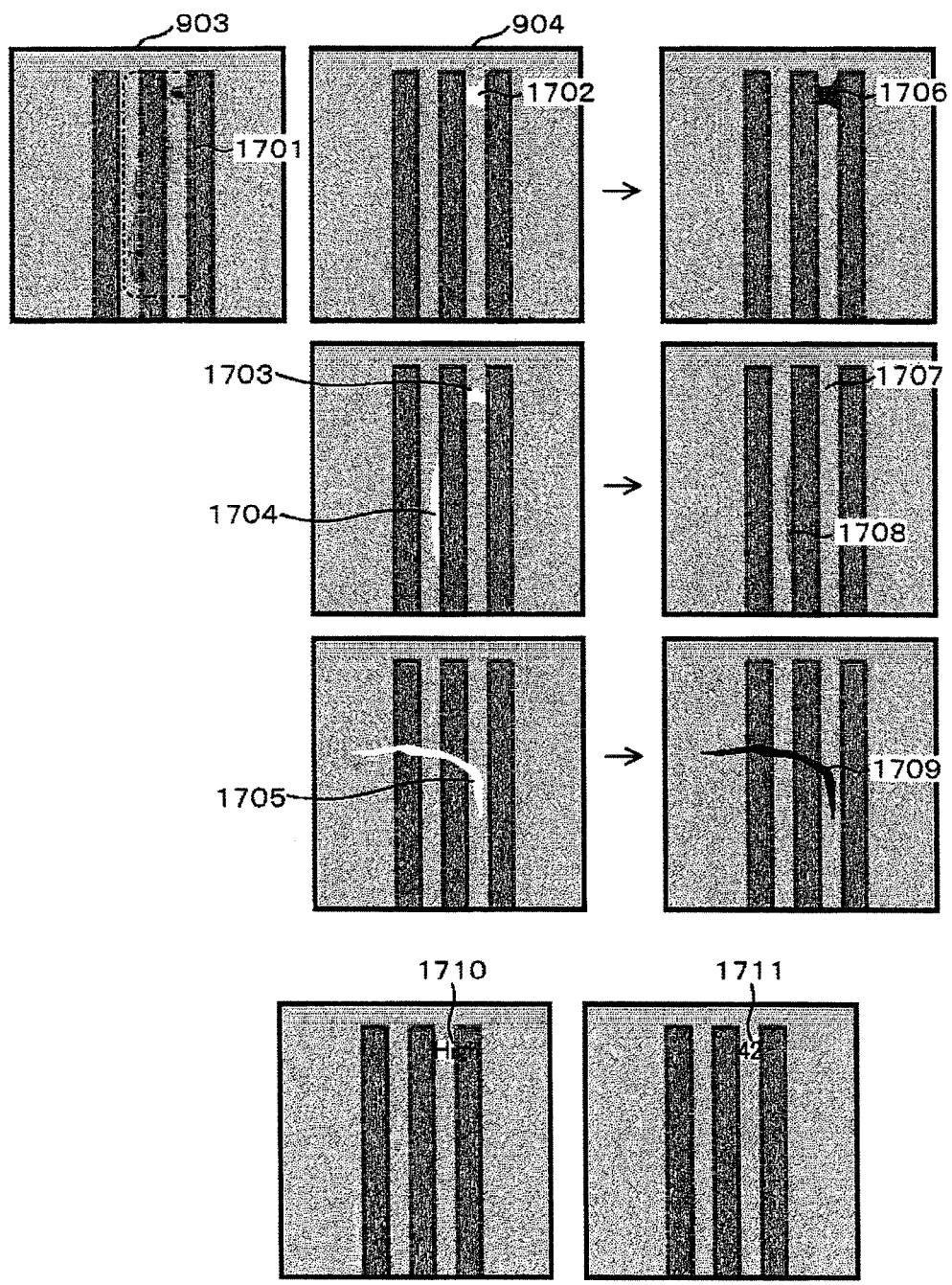
FIG. 17 is an explanatory view of a display example of the occurrence frequency of defect candidates.

Moreover, as an application of FIG. 16, upon confirming the individual images and defect detection results by using the GUI shown in FIG. 9, the frequency of each of the defects may be illustrated. Referring to FIG. 17, this configuration is explained.

FIG. 17 shows a template image 903 whose frequency can be displayed in an overlaid manner and individual acquired images 904, which are drawn from the GUI for use in confirming the frequency explained in FIG. 9. On the template image 903, a portion 1701 indicating the distribution of the occurrence frequency of defects is displayed, and portions 1702 to 1705 represent defects detected from the individual acquired images. For example, in the case when these defects are displayed with respectively different colors as indicated by portions 1706 to 1709 based upon the distribution of the occurrence frequency, the resulting display can be utilized for determining whether a defect of a currently confirming image is a special one or one of those frequently occur. The determination as to which frequency the detected defect corresponds may be carried out in the same manner as in the above-mentioned determination as to the systematic defect, or may be carried out by using another method. For example, as explained in FIG. 16, the determination may be made based upon the degree of overlaid state between the individual defect region and the region having a predetermined occurrence frequency or more, or may be made by taking the highest frequency of the pixels in each of the defect region as the occurrence frequency of the corresponding defect.

Moreover, as the display method, in addition to the color-coded method, a method in which characters of High, Middle and Low are added in accordance with the degree of frequency (1710), a method in which the number of images with a defect occurring therein is displayed (1711), or the like may be used. These expressing methods are exemplary described only, and other methods may also be used.

As described above, an acquired image is compared with a template image without a defect so as to be inspected, and the place of a defect is specified every pixel unit or every unit similar thereto, and its frequency is found as a distribution on the template image so that by displaying the distribution together with the pattern of a sample, the user is allowed to recognize a positional relationship between the distribution of defect occurrence frequency of the target inspection place and the pattern. Moreover, by finding the defect occurrence frequency every pixel unit and carrying out a mapping process, the analysis can be carried out in more detail.

In the above-described embodiment, the line pattern is exemplified; however, the pattern of the inspection target is not limited only by this. Regardless of the kinds of graphics, a hole pattern, a rectangular pattern, or the like may be applied.

Additionally, the present invention is not intended to be limited by the above-mentioned embodiment, and various modified examples are included therein. For example, the above embodiment has been described in detail so as to make the present invention easily understood, and the present invention is not necessarily limited by a configuration provided with all the configurations that have been explained. Moreover, one portion of a configuration of one embodiment may be replaced by a configuration of another embodiment, or to a configuration of one embodiment, a configuration of another embodiment may be added. Furthermore, with respect to one portion of a configuration of each embodiment, another configuration may be added thereto, or one configuration may be deleted therefrom or replaced with another configuration.

101 Electron Gun
102 Lens
103 Deflector

104 Objective Lens
105 Sample
106 Sample Base
107 Electron Beam
108 Secondary Electron
109 Reflected Electron
110 Lens Control Circuit
111 Deflection Control Circuit
112 Objective Lens Control Circuit
113 Analog/Digital Converter
114 Address Control Circuit
115 Image Memory
116 Mechanism Control Circuit
117 Display Unit
118 Control Unit
119 Image Processing Unit
120 Input Unit
121 External Input/Output Unit
122 Secondary Electron Detector
123 Reflected Electron Detector
124 Moving Stage

The invention claimed is:

1. A charged particle beam apparatus, which detects a defect of a pattern of a sample by irradiating a charged particle beam thereto, the charged particle beam apparatus comprising:
   a charged particle beam optical system for detecting secondary charged particles by irradiating the charged particle beam to the sample;
   an image processing unit for, based upon a plurality of images to be inspected that are obtained by the secondary charged particles, obtaining a two-dimensional distribution in a sample surface of an occurrence frequency of defect candidates for each of predetermined regions inside the detected image; and
   a display unit for displaying the distribution of the occurrence frequency of the defect candidates in association with the pattern.

2. The charged particle beam apparatus according to claim 1, wherein the image processing unit obtains an occurrence frequency of defect candidates every pixel unit.

3. The charged particle beam apparatus according to claim 1,
   wherein the image processing unit comprises:
   a classifying unit for classifying a plurality of images to be inspected into a plurality of groups;
   a template image generation unit for generating a template image that is obtained based upon images of each of the plurality of groups;
   a defect detection unit for detecting defect candidates by comparing the image to be inspected with the template image of a portion corresponding to the image to be inspected; and
   an arithmetic processing unit for finding an occurrence frequency of the defect candidates by counting the number of times in which determinations are made as the defect candidates in each of the pixels on the template image.

4. The charged particle beam apparatus according to claim 3,
   wherein the classifying unit carries out a classifying process based upon either of coordinate values at which the image to be inspected is acquired or the degree of similarity between the images to be inspected, or based upon both of these.

5. The charged particle beam apparatus according to claim 1, further comprising:
   selection means for selecting a wafer, a die or an observation place,
   wherein, by using an image of the wafer, die or observation place selected by the selection means, the occurrence frequency of the defect candidates is found.

6. The charged particle beam apparatus according to claim 1,
   wherein, by using images to be inspected obtained from a plurality of wafers, the occurrence frequency of the defect candidates is found.

7. The charged particle beam apparatus according to claim 1,
   wherein kinds of defects are classified based upon the occurrence frequency of the defect candidates and positions of the defect candidates of the image to be inspected.

8. The charged particle beam apparatus according to claim 7,
   wherein, based upon the degree of overlaid state between the region having a predetermined occurrence frequency or more of the defect candidates and the region of the defect candidates of the image to be inspected, determination is made between a systematic defect and a random defect.

9. The charged particle beam apparatus according to claim 3,
   wherein the template image is an image obtained by adding a plurality of the images to be inspected.

10. The charged particle beam apparatus according to claim 3,
    wherein, from the plurality of images to be inspected, the classifying unit classifies images including rotation symmetrical or inversion symmetrical circuit patterns as one group.

11. The charged particle beam apparatus according to claim 1,
    wherein the display unit displays the occurrence frequency of the defect candidates by using a color corresponding to the occurrence frequency for each of the predetermined regions.

12. The charged particle beam apparatus according to claim 1,
    wherein the display unit displays the occurrence frequency of the defect candidates by using a color corresponding to the occurrence frequency for each of the defect candidates.

13. The charged particle beam apparatus according to claim 3,
    wherein the occurrence frequency of defects is displayed in an overlaid state with the template image, the image to be inspected, or design data corresponding to the image to be inspected.

14. The charged particle beam apparatus according to claim 2,
    wherein the occurrence frequency of the defect candidates found every pixel unit is integrated based upon every plural pixels, and displayed as the occurrence frequency of defect candidates for every corresponding plural pixels.

* * * * *